US007645512B1

(12) United States Patent
Sammakia et al.

(10) Patent No.: US 7,645,512 B1
(45) Date of Patent: Jan. 12, 2010

(54) NANO-STRUCTURE ENHANCEMENTS FOR ANISOTROPIC CONDUCTIVE ADHESIVE AND THERMAL INTERPOSERS

(75) Inventors: Bahgat Sammakia, Binghamton, NY (US); Wayne E. Jones, Jr., Vestal, NY (US); Ganesh Subbarayan, W. Lafayette, IN (US)

(73) Assignee: The Research Foundation of the State University of New York, Binghamton, NY (US)

( * ) Notice: Subject to any disclaimer, the term of this patent is extended or adjusted under 35 U.S.C. 154(b) by 220 days.

(21) Appl. No.: 10/402,293

(22) Filed: Mar. 31, 2003

(51) Int. Cl.
*H01B 1/20* (2006.01)
*H01R 4/04* (2006.01)
*H01R 11/01* (2006.01)

(52) U.S. Cl. .................. 428/403; 428/357; 428/364; 428/381; 252/500; 252/512; 252/518.1; 29/830; 29/832; 174/88 R; 174/94 R; 156/349; 156/367; 156/275.7; 439/74; 439/79; 438/107

(58) Field of Classification Search .......... 252/502, 252/512, 511, 513, 518.1; 428/403, 407
See application file for complete search history.

(56) References Cited

U.S. PATENT DOCUMENTS

| | | | | |
|---|---|---|---|---|
| 4,740,657 A | * | 4/1988 | Tsukagoshi et al. | 174/88 R |
| 5,336,443 A | * | 8/1994 | Odashima | 252/511 |
| 5,409,520 A | * | 4/1995 | Mori et al. | 75/255 |
| 5,578,325 A | * | 11/1996 | Domb et al. | 424/501 |
| 5,585,037 A | * | 12/1996 | Linton | 252/506 |
| 5,837,119 A | * | 11/1998 | Kang et al. | 205/74 |
| 6,344,156 B1 | * | 2/2002 | Yamada et al. | 252/512 |
| 6,755,886 B2 | * | 6/2004 | Phillips et al. | 75/346 |
| 6,770,369 B1 | * | 8/2004 | Oyamada et al. | 428/403 |
| 7,036,573 B2 | * | 5/2006 | Koning et al. | 165/185 |
| 2002/0149005 A1 | * | 10/2002 | Khattar et al. | 252/500 |

FOREIGN PATENT DOCUMENTS

WO      WO 00/51138      *   8/2000

\* cited by examiner

*Primary Examiner*—Silverman Stanley
*Assistant Examiner*—Kallambella Vijayakumar
(74) *Attorney, Agent, or Firm*—Hoffberg & Associates

(57) ABSTRACT

The present invention features additions of nano-structures to interconnect conductor fine particles (spheres) to: (1) reduce thermal interface resistance by using thermal interposers that have high thermal conductivity nano-structures at their surfaces; (2) improve the anisotropic conductive adhesive interconnection conductivity with microcircuit contact pads; and (3) allow lower compression forces to be applied during the microcircuit fabrication processes which then results in reduced deflection or circuit damage. When pressure is applied during fabrication to spread and compress anisotropic conductive adhesive and the matrix of interconnect particles and circuit conductors, the nano-structures mesh and compress into a more uniform connection than current technology provides, thereby eliminating voids, moisture and other contaminants, increasing the contact surfaces for better electrical and thermal conduction.

34 Claims, 6 Drawing Sheets

NANO-STRUCTURE ENHANCEMENTS FOR ANISOTROPIC CONDUCTIVE ADHESIVE AND THERMAL INTERPOSERS

FIELD OF THE INVENTION

The invention pertains to electrical circuit interconnections and, more particularly, to the addition of nano-structures that facilitate thermal dissipation and electrical conductivity in microcircuits that are fabricated using conductive adhesives and anisotropic conductive adhesives.

BACKGROUND OF THE INVENTION

Discussion of the Related Art

Clearly, the continuing development of microcircuits includes, among others, the objectives of: application of flexible printed circuits, increased capacity (more switching functions in smaller devices), and a host of robustness issues, such as moisture control, improved shock-resistance, and use in higher temperature applications. These issues become more crucial when printed circuits are used in environments in which they are shocked or vibrated, as in machinery or fighter planes, or when high temperature, moisture, or contamination is experienced, as in industrial corrosive and high-humidity environments and in the engine compartment vehicle. To achieve these objectives, improvements in the connections between microcircuit components and the circuit chip or printed circuit board must be made.

Conductive adhesives and anisotropic conductive adhesives (ACA) have been used regularly in microcircuit fabrication, and their composition has been well described. Isotropic conductive adhesives (ICA) are hereinafter referred to as conductive adhesives.

These adhesive compositions consist primarily of an insulating adhesive resin carrier in which a matrix of interconnect fine particles is suspended. For the purpose of this description, such fine particles and the device and circuit board connections, including metal, metallized polymer, carbon or carbonaceous, micron or sub-micron sized shapes, including spheres, rods, tubes, conductors for heat transfer or electrical connection, printed circuit substrates and lands, and/or other regular and irregularly shaped particles and connectors, upon which nano-structures are attached or grown, are referred to as spheres. The spheres in the adhesive compositions, when squeezed under pressure during microcircuit fabrication, interconnect the components and layers of the microcircuit chip or circuit board. It is to be particularly emphasized that the nano-structures are grown on the flat surfaces of the conductor pads, printed circuit substrates and connectors and are not limited to the surface of particles in dispersion in an adhesive matrix. In other words, any body on which surface these nano-structures are grown is referred to as a sphere regardless of its shape.

For the purpose of description, the nano-structures are drawn as columns in the figures, but they may be spikes, cylinders, tubes, hemispheres, fibers, or any other regular or irregular shape; they are referred to as nano-structures.

The adhesive compositions have several purposes including, but not limited to: providing the carrier medium for the matrix of interconnect spheres to be distributed between the microcircuit devices and conductor pads; providing the thermal path for heat that is generated by the switching functions; the cured adhesive supports and electrically insulates between interconnection particles and conductors on the microcircuits, and it prevents moisture or other contaminants from getting into or being entrapped within the interconnections.

Several problems arise from the use of conductive adhesives and anisotropic conductive adhesive that affect the capacity of the microcircuit, specifically, thermal dissipation and electrical interconnection. Those effects, in turn, can limit the number of circuit switches on, or logic operations performed by, a microcircuit. One of these problems is a need to apply high pressure to the microcircuit during fabrication that can damage or misalign parts of the circuit. Also, entrapped air in voids has lower thermal conductivity and can limit heat dissipation from the microcircuit. Third, increased resistance in the interconnect can result from insufficient interconnect particle to contact surface connection.

It would be advantageous to provide conductive adhesives and anisotropic conductive adhesive interconnects in which thermal and electrical interconnection resistance and distortion or damage of circuit boards are reduced or eliminated. With existing interconnects, regardless of specific metal or metallized polymer or carbonaceous material used for interconnects, or whether their surfaces are smooth or irregular, the thermal and electrical conductivity and board distortion or damage problems described above exist to varying degrees.

SUMMARY OF THE INVENTION

The present invention adds nano-structures to interconnect conductor spheres to: reduce thermal interface resistance by using thermal interposers that have high thermal conductivity nano-structures at their surfaces; improve the conductive adhesives and anisotropic conductive adhesive interconnection conductivity with microcircuit contact pads; and, allow lower compression forces to be applied during the microcircuit fabrication processes which then results in reduced deflection or circuit damage.

Accordingly, the present invention provides an innovative improvement in conductive adhesives and anisotropic conductive adhesive interconnection technology by growing or attaching nano-structures to the interconnect particles and the microcircuit connection pads which address the problems listed above. When pressure is applied during fabrication to spread and compress conductive adhesives and anisotropic conductive adhesive and the matrix of interconnect particles and circuit conductors, the nano-structures mesh and compress into a more uniform connection than current technology provides, thereby eliminating voids, moisture, and other contaminants, increasing the contact surfaces for better electrical and thermal conduction.

BRIEF DESCRIPTIONS OF THE DRAWINGS

A complete understanding of the present invention may be obtained by reference to the accompanying drawings, when considered in conjunction with the subsequent detailed description, in which:

FIGS. 1a, 1b, and 1c, taken together, show a schematic diagram depicting, in general, the prior art process of anisotropic conductive adhesive with a matrix of interconnect spheres electrically and thermally connecting contacts and conductors of a microcircuit or circuit board;

Figure 5:
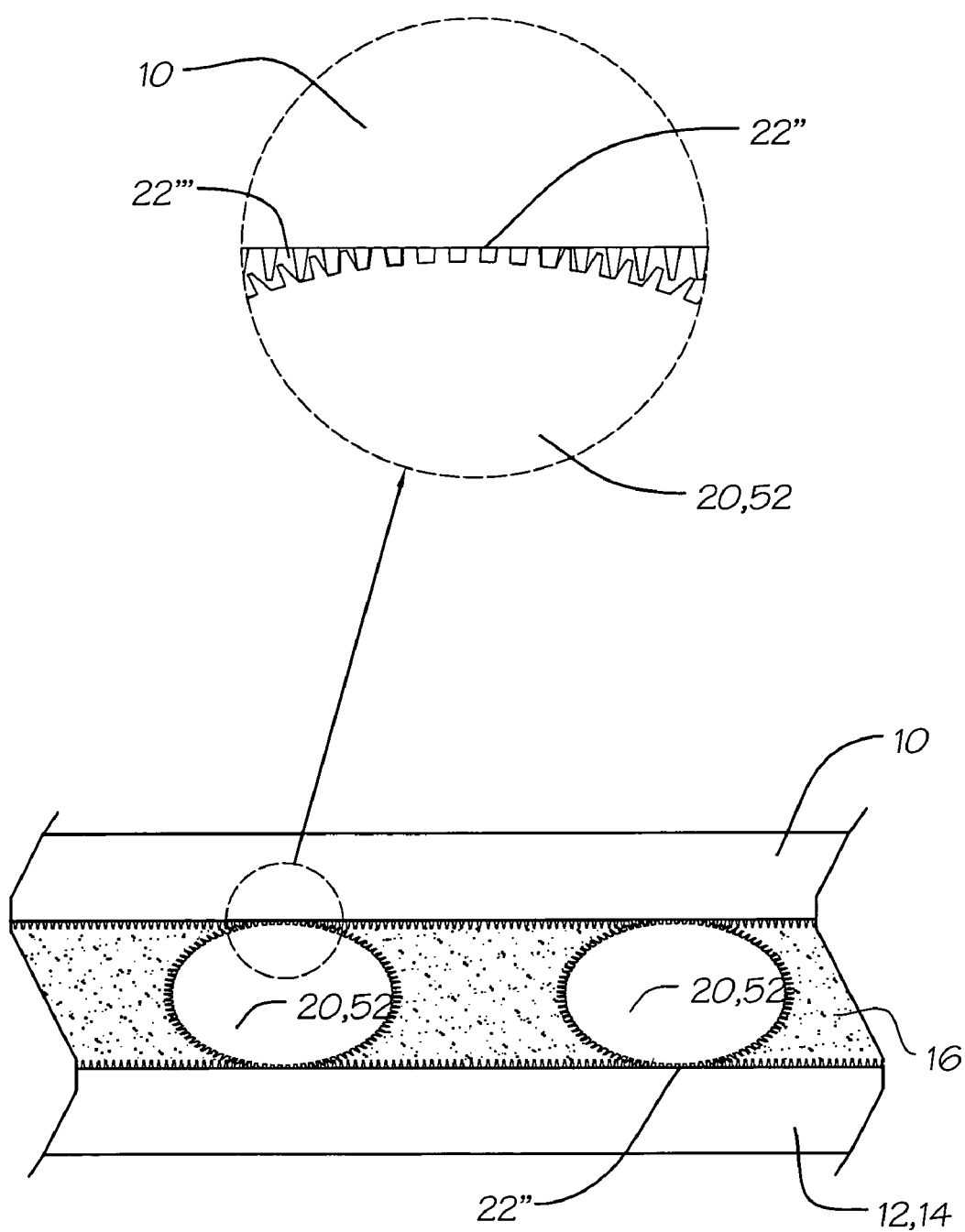
Figure 6A:
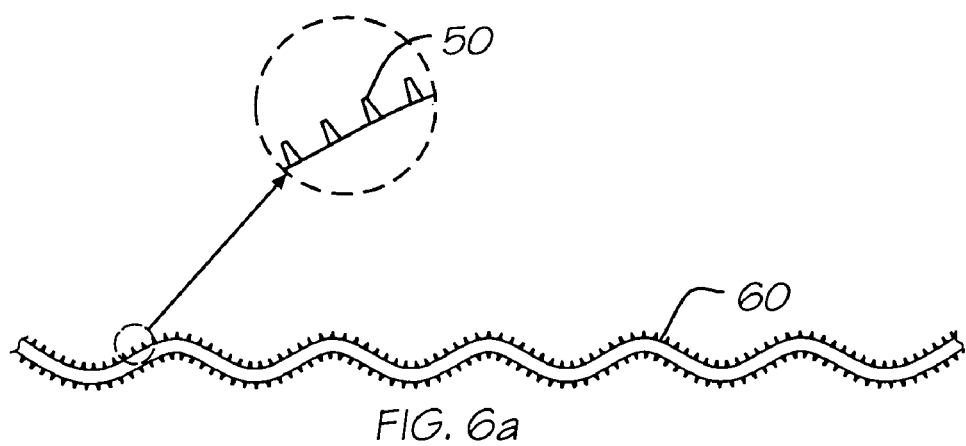
Figure 6B:
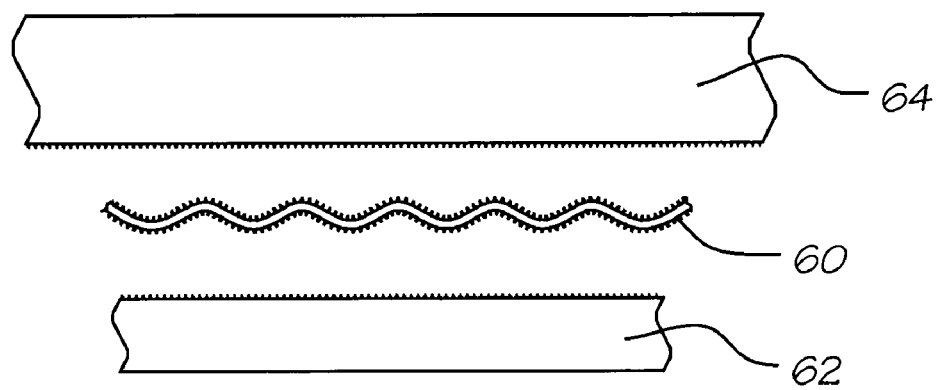
Figure 6C:
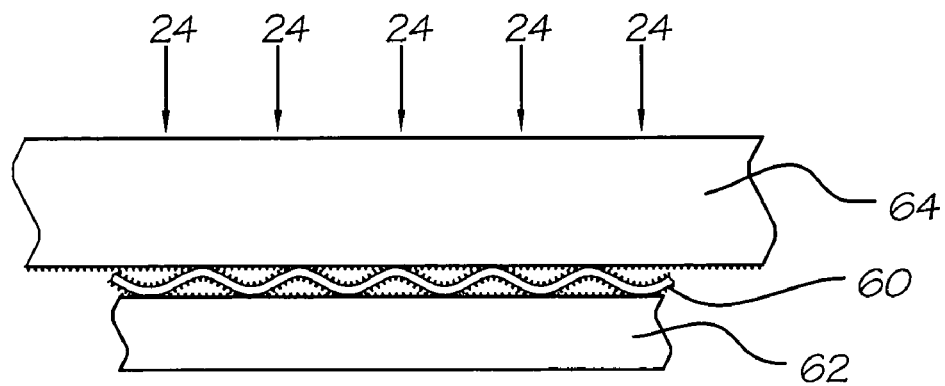

FIGS. 4a, 4b, 4c and 4d, taken together, show a schematic diagram depicting, in general, the nano-structures of the present invention attached to or grown from an interconnect sphere and a thermally conductive tube;

FIG. 5 is a schematic diagram depicting an assembly of a chip to a heat sink using a thermal plane as an interface with nano-structures attached; and FIGS. 6a, 6b, and 6c, taken together, show a schematic diagram depicting the nano-structures meshing and compressing into a more uniform connection than current technology provides, thereby eliminating voids, moisture, and other contaminants, increasing the contact surfaces for better electrical and thermal conduction.

Figure 6D:
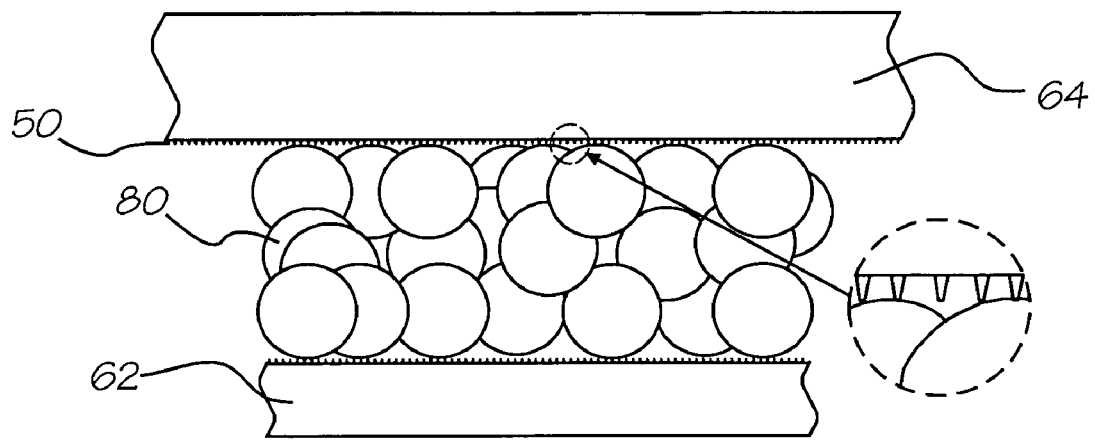
Figure 6E:
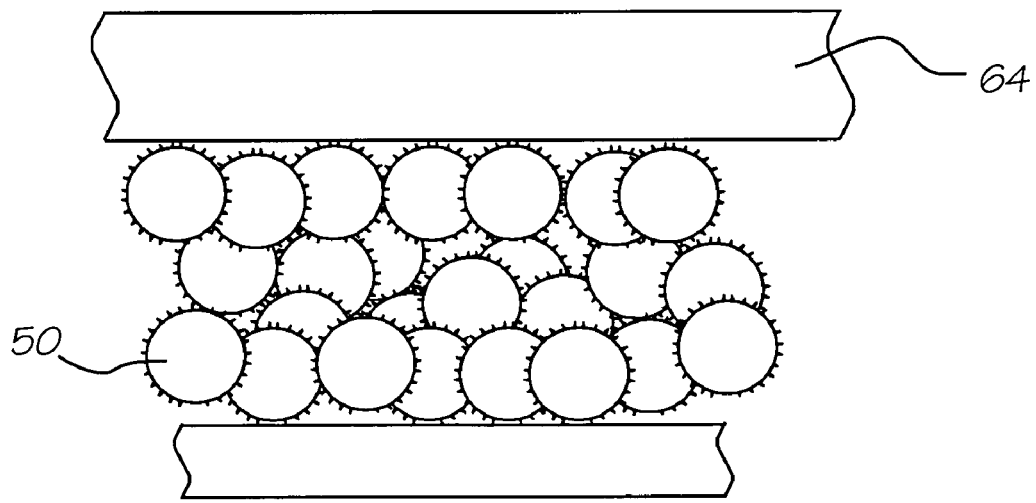

FIGS. 6d and 6e, taken together, show a schematic diagram depicting the nano-structures grown on filler material particles and heat sink to improve their contact within the anisotropic adhesive system.

DETAILED DESCRIPTION OF THE PREFERRED EMBODIMENT

Generally speaking, the invention pertains to electrical circuit interconnections. More specifically, the invention features the addition of nano-structures that facilitate thermal dissipation and electrical conductivity in microcircuits, and reduce circuit board deflection when fabricated using anisotropic conductive adhesives.

An anisotropic conductive adhesive system for fabricating microcircuits consists primarily of an insulating adhesive resin carrier in which a matrix of interconnect spheres is suspended. The spheres in the adhesive compositions, when squeezed under pressure during microcircuit fabrication, interconnect the components and layers of the microcircuit chip or circuit board.

Figure 1A:
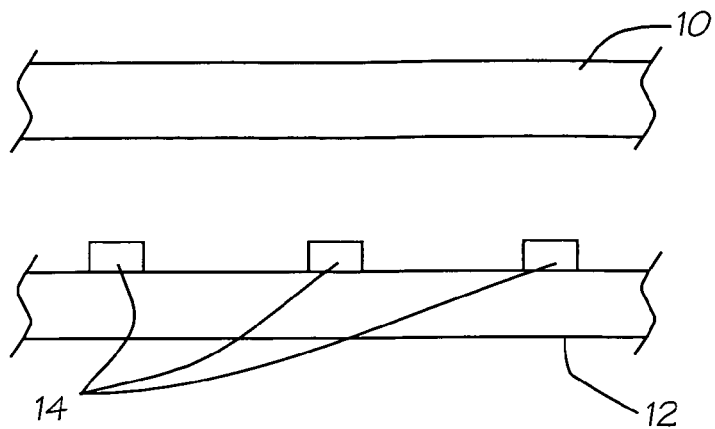
Figure 1B:
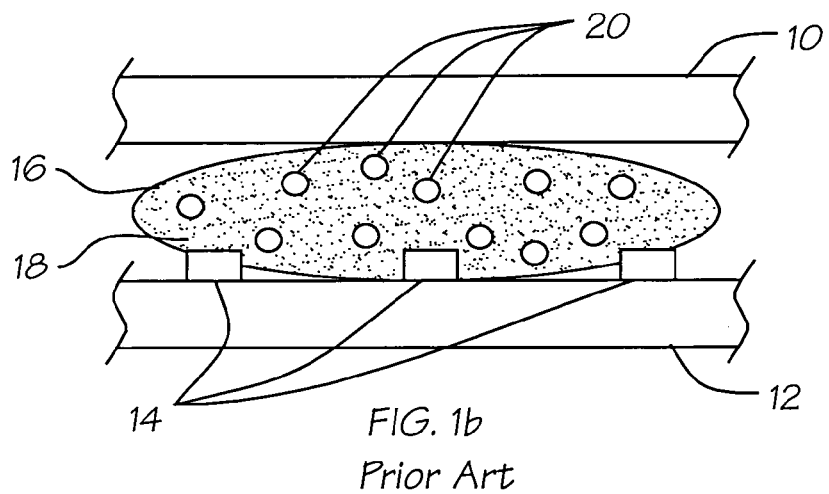
Figure 1C:
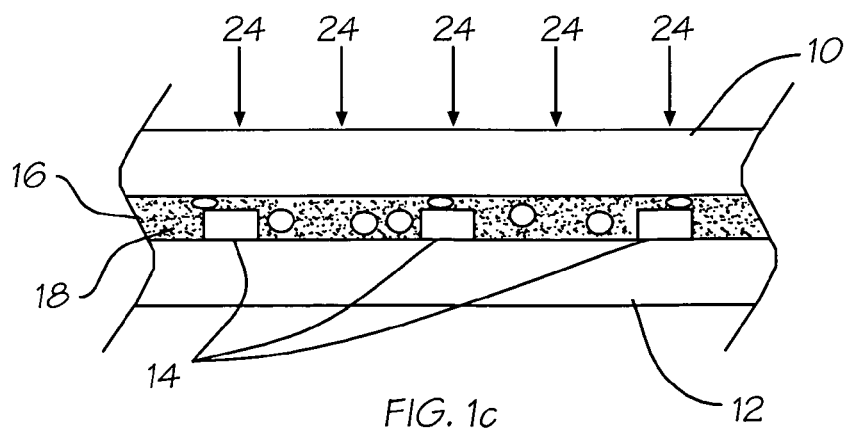

Referring to FIGS. 1a, 1b, and 1c, there are shown schematic drawings of typical microcircuit fabrication of the prior art. Assemblies of circuit fabrication are schematically represented in FIG. 1a by upper and lower circuit boards 10 and 12, respectively, which may be conductors, components, substrates, circuit boards, chips, or devices. Boards 10 and 12 have device connectors or printed circuits or thermal conductors 14 as shown on the lower board 12.

An anisotropic conductive adhesive 16 (FIG. 1b) is applied between the upper and lower boards 10, 12. The anisotropic conductive adhesive 16 consists of a polymer carrier 18 with a matrix of interconnect spheres 20.

Pressure (arrows 24) is applied to the upper and lower boards 10, 12 (FIG. 1c) forcing the anisotropic conductive adhesive 16 throughout the spaces on and between the boards 10, 12, and compressing the interconnect spheres 20 to make the interconnections between the boards 10, 12 and device connectors or printed circuits or thermal conductors 14.

Figure 2:
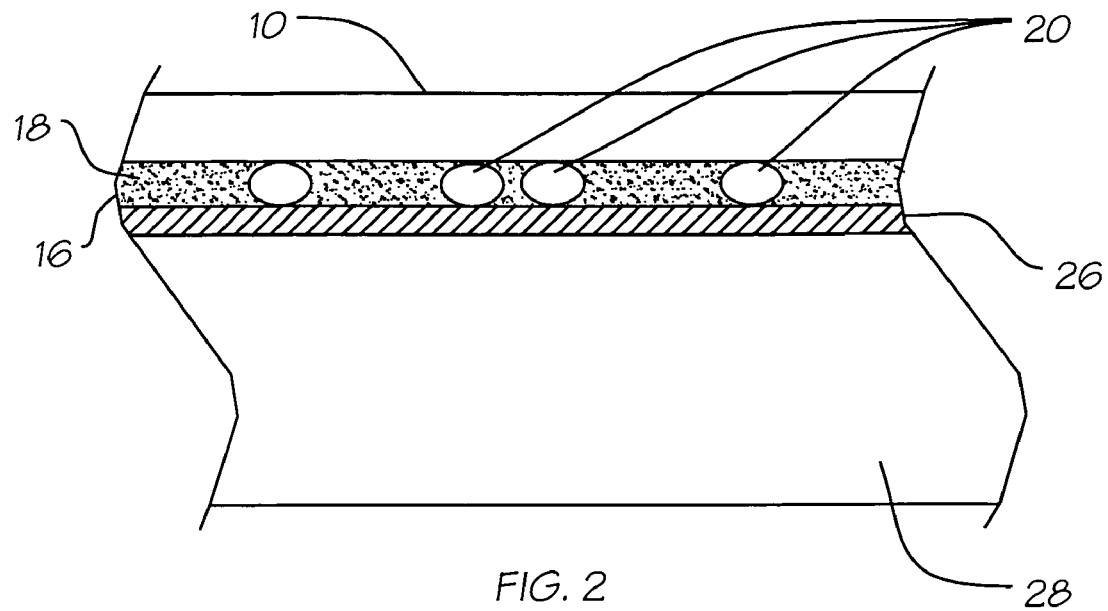
FIG. 2 is a schematic diagram of one example of prior art liquid crystal display (LCD) technology showing the compressed metallized polymer conductive sphere within the anisotropic conductive adhesive interconnecting the circuit conductor to the ITO metallization layer on the LCD glass.

Referring now to FIG. 2, there is shown a schematic diagram of a liquid crystal device (LCD), which is one specific type of microelectronic circuit using anisotropic conductive adhesive fabrication. The anisotropic conductive adhesive 16 with the polymer carrier 18 and spheres 20 has been pressed so that conductor 25, an example of the upper assembly 10 (FIG. 1a), is interconnected to ITO metallized layer 26 on glass substrate 28, an example of the lower board 12 (FIG. 1a).

Figure 3:
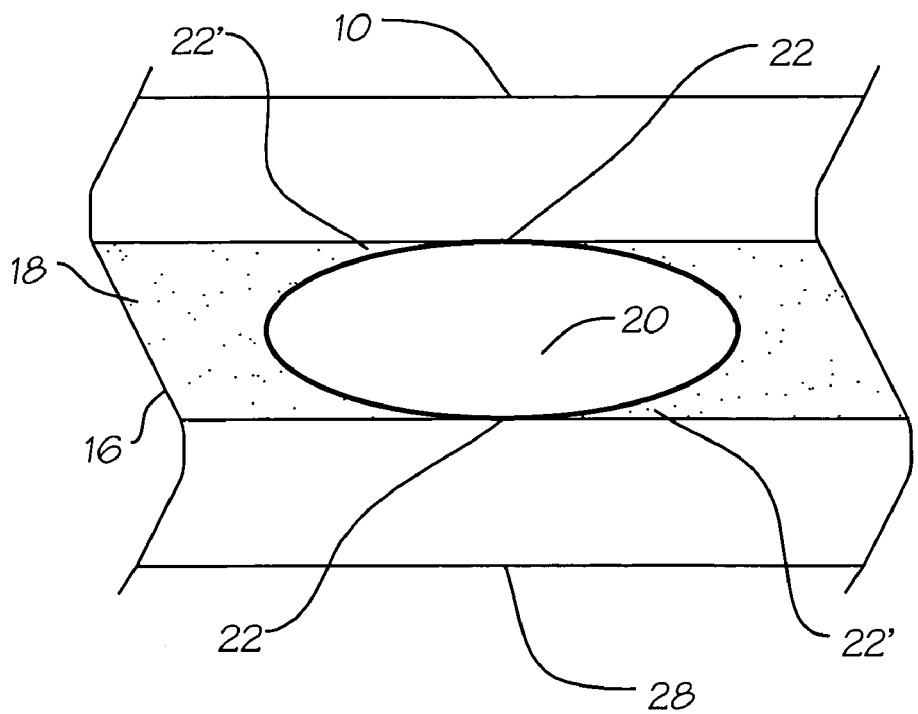
FIG. 3 is a schematic diagram depicting a prior art thermal interposer wherein a single smooth-walled particle contacts similarly smooth surfaces.

Referring now to FIG. 3, which is an enlarged view of FIG. 2 showing the contact between a single particle 20 (FIG. 2O), the device surface 10 and the board 28. Voids or pockets 22' of adhesive carrier 16 or contaminants in those pockets 22', such as moisture, keep the heat transfer and electrical conductivity low between the device surface 10, device connectors or printed circuits or thermal conductors, not shown, and the interconnect spheres 20.

Figure 4A:
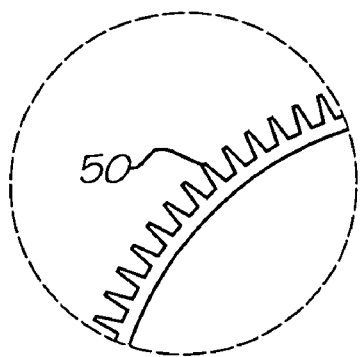
Figure 4B:
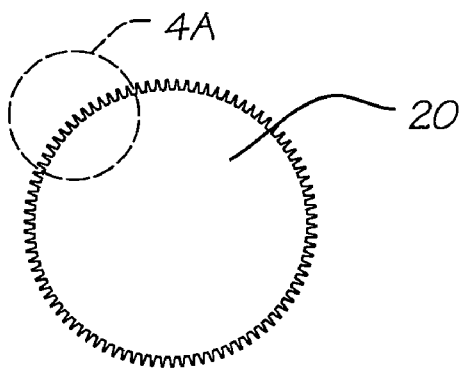
Figure 4C:
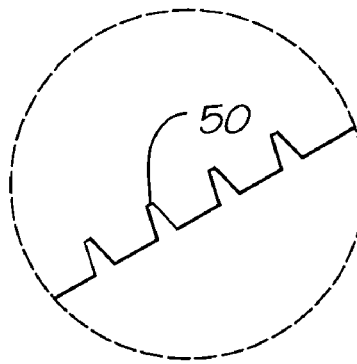
Figure 4D:
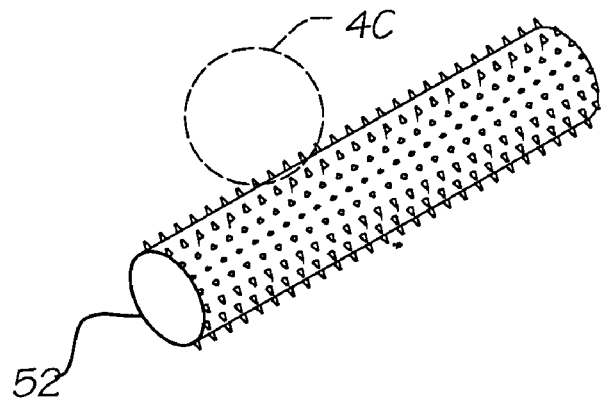

Referring now to FIGS. 4a, 4b, 4c and 4d, there are shown two of many shapes onto which nano-structures 50 are attached or grown. FIG. 4b shows an interconnect sphere 20 with nano-structures 50, enlarged in FIG. 4a. FIG. 4d shows a thermally conductive tube 52 with nano-structures 50, enlarged in FIG. 4c.

It should be understood that interconnects and thermal conductors may be made in shapes other than spheres and tubes. Also, it should be understood that shapes other than the flat surfaces shown in diagrams for conductors and circuit boards can be used. And, further, shapes other than the columns shown may be used for the nano-structures.

Typically, the size range of fine particle interconnects and thermal conductors, represented here by a sphere 20 and a tube 52, are 1 to 20 microns ($1\times10^{-6}$ meter) in diameter.

The nano-structures 50 attached to or grown from the surfaces of spheres 20 and thermal conductor tubes 52 are 1 to 200 nano-meters ($1\times10^{-9}$ meter) in size. The materials the nano-structures can be made from include: carbon, metal, polymers, metallized polymers, electrical and thermal conducting materials and the like; the shapes of these nano-structures include columns, spikes, cylinders, tubes, hemispheres, fibers, regular, and irregular shapes.

Referring now to FIG. 5, there is shown a schematic diagram of a fabricated circuit with the inventive nano-structures 50 attached to or grown from interconnect spheres 20 or thermal conductor tubes 52, and inventive nano-structures 50 attached to or grown from boards 10, 12. Anisotropic conductive adhesive 16 is disposed throughout the spaces between the boards 10, 12. The invention improves the prior art by adding nano-structures 50 to the interconnect spheres 20, and the surfaces of boards 10, 12, which mesh and compress into a more uniform connection 22", thereby eliminating voids, moisture and other contaminants 22''', increasing the contact surfaces 22" for better electrical and thermal conduction.

As the number of nano-structures 50 attached to or grown on the surfaces of boards 10, 12, spheres 20, and thermal conductor tubes 52 are increased by making them uniform and consistently spaced, the thermal conduction and electrical connection are improved.

Additionally, because the interconnect contact surface 22" is increased with the meshing of the nano-structures, improved contact can be achieved with lower pressure (arrows 24, FIG. 1c) applied to the circuit components and circuit boards 10, 12, and connections 14 (FIG. 1a) than is required by conventional techniques. Lower pressure results in reduced distortion and less likelihood of damage of the circuit boards 10, 12 and connections 14.

Referring now to FIGS. 6a, 6b, and 6c, there are shown schematic diagrams depicting one specific type of fabricated circuit, assembly of a chip 62 to a heat sink 64, with a thermal plane 60, shown for the purpose of example. Nano-structures 50 are attached to or grown from a thermal plane interface 60 and circuit chip 62 and heat sink 64.

Thermal planes 60 may be made of rigid or flexible metal, metallized soft substrate, or any other high thermal conductivity material. Thermal plane shapes may be corrugated waves as shown or any other regular or irregular shape that fits the needs of the circuit fabrication.

Assemblies of circuit fabrication are schematically represented in FIG. 6b by thermal plane interface 60 and circuit chip 62 and heat sink 64.

In FIG. 6c, pressure (arrows 24) is applied to the circuit chip 62 and heat sink 64 to make the interconnections between the thermal plane interface 60 and circuit chip 62 and heat sink 64.

In operation, the nano-structures 50 may be attached to or grown from the surfaces of the spheres 20, electrical and thermal conductors, device connectors 14, and other surfaces of circuit assemblies by sputtering, dissolving in highly volatile solution and spray coat, sol-gel, fluidized bed, epitaxial growth, chemical vapor deposition (CVD), precipitations, or any other process that befits the needs of the circuit fabrication.

Referring now to FIGS. 6d and 6e, there are shown schematic diagrams depicting an assembly of a heat sink 64 and a circuit element 62 nano-structures 50 grown on filler material particles 80 or heat sink 64 to improve their contact within the anisotropic adhesive system. In contrast to the arrangement of FIGS. 5, 6a, 6b, and 6c in this arrangement, the filler particles are much smaller than the gap 82 between the package elements 62 and 64, and therefore, they will cluster together in the wall layer 84 and core layer 86, and a thermal path requires several particles 80 to bridge the gap 82.

In FIG. 6d, nano-structures 50 are attached to or grown from heat sink 64, and in FIG. 6e, nano-structures 50 are attached to or grown from filler material particles 82.

Alternate embodiments of the present invention may be implemented with nano-structures appended to or grown from the surface of any contact surface, such as a flexible card with bowed circuit lands, where the meshing of the nano-structures maintains better contact between the interconnect spheres, thermal tubes, circuit conductors, and components.

Since other modifications and changes varied to fit particular operating requirements and environments will be apparent to those skilled in the art, the invention is not considered limited to the example chosen for purposes of disclosure, and covers changes and modifications which do not constitute departures from the true spirit and scope of this invention.

Having thus described the invention, what is desired to be protected by Letters Patent is presented in the subsequently appended claims.

What is claimed is:

1. An anisotropic conductive adhesive, mechanically and electrically interconnecting at least two components adjacent to the adhesive and disposed along a common compression axis through the adhesive, and electrically isolating the at least two components from at least one third component also adjacent to the adhesive and not being disposed along a common compression axis with respect to the at least two components, to thereby provide anisotropic electrical conduction properties, the at least two components and the at least one third component embodying an electronic circuit, said anisotropic conductive adhesive comprising:
   (a) an electrically insulating adhesive carrier mechanically interconnecting the at least two components spaced across the compression axis through the adhesive and the at least one third component, and to exclude external moisture after curing;
   (b) a plurality of fine interconnect particles suspended in said electrically insulating adhesive carrier, each of said fine interconnect particles having an outer surface; and
   (c) a plurality of electrically and thermally conductive nano-structures, forming a coating on at least a portion of said outer surface of said fine interconnect particles, said coating providing increased thermal conductivity of the anisotrophic conductive adhesive, with respect to a particle without said non-structures,
   wherein said plurality of fine interconnect particles having a plurality of electrically and thermally conductive nano-structures formed on said outer surface thereof are provided:
   (i) in sufficient proportion within said electrically insulating carrier such that, after compression and curing of said electrically insulating adhesive carrier, an electrical pathway is selectively formed across a gap along the compression axis between the at least two components through said plurality of fine interconnect particles by a meshing of said plurality of electrically and thermally conductive nano-structures of adjacent particles along the common compression axis, and
   (ii) in limited proportion such that the at least one third component displaced from the common compression axis of the at least two components is substantially electrically insulated from the at least two components by portions of said electrically insulating adhesive carrier which are not connected by a meshing of said plurality of electrically and thermally conductive nano-structures of adjacent particles.

2. The anisotropic conductive adhesive in accordance with claim 1, wherein said insulating adhesive carrier comprises a polymer resin.

3. The anisotropic conductive adhesive in accordance with claim 1, wherein said fine interconnect particles have sizes in the micron to sub-micron range.

4. The anisotropic conductive adhesive in accordance with claim 1, wherein said plurality of fine interconnect particles are rods having a diameter in the range of between approximately 1 and 20 microns.

5. The anisotropic conductive adhesive in accordance with claim 1, wherein said nano-structures have a spike shape.

6. The anisotropic conductive adhesive in accordance with claim 1, wherein said nano-structures have a size in the range of approximately between 1 and 200 nano-meters.

7. The anisotropic conductive adhesive in accordance with claim 1, wherein said nano-structures are formed from one or more materials selected from the group consisting of carbon, metal, and metallized polymer.

8. The anisotropic conductive adhesive in accordance with claim 1, wherein said nano-structures have an irregular shape.

9. The anisotropic conductive adhesive in accordance with claim 1, wherein said nano-structures are formed by sputtering.

10. The anisotropic conductive adhesive in accordance with claim 1, wherein said nano-structures are formed by a spray coat sol-gel process.

11. The anisotropic conductive adhesive in accordance with claim 1, wherein said nano-structures are formed by a fluidized bed process.

12. The anisotropic conductive adhesive in accordance with claim 1, wherein said nano-structures are formed by epitaxial growth.

13. The anisotropic conductive adhesive in accordance with claim 1, wherein said nano-structures are formed by chemical vapor deposition.

14. The anisotropic conductive adhesive in accordance with claim 1, wherein said nano-structures are formed by precipitation.

15. The anisotropic conductive adhesive in accordance with claim 1, wherein said plurality of fine interconnect particles are electrically insulating.

16. The anisotropic conductive adhesive in accordance with claim 1, wherein said plurality of fine interconnect particles are formed from a material selected from one or more of the group consisting of metal, carbon or carbonaceous materials, ceramics and oxides.

17. The anisotropic conductive adhesive in accordance with claim 1, wherein said plurality of fine interconnect particles comprise shapes selected from the group consisting of one or more of rods and tubes.

18. The anisotropic conductive adhesive in accordance with claim 1, wherein said plurality of fine interconnect particles comprise shapes selected from the group consisting of one or more of solid and hollow regular polygons and irregularly shaped polygons.

19. The anisotropic conductive adhesive in accordance with claim 1, wherein the two components are displaced across a gap along the compression axis, said fine interconnect particles having a minimum dimension less than said gap.

20. The anisotropic conductive adhesive according to claim 1, wherein said fine interconnect particles comprise shapes selected from the group consisting of one or more of solid and hollow regular polygons and irregularly shaped polygons.

21. The anisotropic conductive adhesive according to claim 1, wherein said plurality of electrically and thermally conductive nano-structures comprise one or more shapes selected from a group consisting of columns, spikes, cylinders, tubes, hemispheres, fibers, rods, solid and hollow regular polygons, and irregularly shaped particles.

22. The anisotropic conductive adhesive according to claim 1, wherein said electrically conductive elements comprise at least one microcircuit and at least one conductor pads of a circuit board, wherein the conductive adhesive adheres the microcircuit to the circuit board and provides a plurality of isolated electrically conductive circuit paths between the micro circuit and the circuit board.

23. In a conductive adhesive adapted to electrically connect at least two pairs of electrical components separated by respective gaps through the conductive adhesive while electrically isolating the at least two pairs of electrical components from each other comprising:
    an electrically insulating adhesive carrier; and
    a plurality of fine non-spherical interconnect particles selected from the group comprising: metal, carbon or carbonaceous materials, ceramics and oxides and having outer surfaces, said interconnect particles being suspended in the electrically insulating adhesive carrier, said plurality of fine interconnect particles comprising shapes selected from the group consisting of one or more of solid and hollow regular polygons and irregularly shaped polygons, at least a portion of said plurality of fine interconnect particles each having a plurality of thermally conductive nano-structures formed on at least a portion of an outer surface thereof, having a shape selected from one or more of the group consisting of columns, spikes, cylinders, tubes, hemispheres, fibers, rods, solid and hollow regular polygons, and irregularly shaped particles, said nano-structures comprising an electrical and thermal conducting material, thereby improving the thermal conductivity thereof,
    wherein the electrically conductive adhesive is adapted to selectively electrically interconnect ones of the pairs of electrically conductive elements provided within a contiguous portion of said conductive adhesive and spaced by a respective gap aligned with a compression axis, without shorting adjacent pairs of electrically conductive elements not separated by the gap aligned with the compression axis, a compression along the compression axis across the gap selectively causing a meshing of the nano-structures on the surface of adjacent interconnect particles subjected to compression along the axis of compression, and selectively not causing a meshing of interconnect particles not respectively subjected to compression along the axis of compression,
    a curing of said electrically insulating adhesive carrier resulting in a cured adhesive structure adapted to support the electrical components and exclude moisture from the gaps, the conductive adhesive being adapted to complete an electrical circuit between a respective pair of elements and selectively conduct electricity and heat along the compression axis and, and electrically insulate between components displaced along an axis perpendicular to the compression axis.

24. The conductive adhesive in accordance with claim 23, wherein said fine interconnect particles comprise shapes selected from the group consisting of one or more of rods and tubes.

25. The conductive adhesive in accordance with claim 23, wherein said nano-structures have a size in the range of approximately between 1 and 200 nano-meters.

26. The conductive adhesive in accordance with claim 23, wherein said fine interconnect particles are rods having a diameter in the range of between approximately 1 and 20 microns.

27. The conductive adhesive in accordance with claim 23, wherein said fine interconnect particles comprise shapes selected from the group consisting of one or more of solid and hollow regular polygons and irregularly shaped polygons.

28. The conductive adhesive in accordance with claim 23, wherein said insulating adhesive carrier comprises a polymer resin.

29. The conductive adhesive in accordance with claim 23, wherein said electrical and thermal conductive material comprises one or more materials selected from the group consisting of carbon, metal, and metallized polymer.

30. The conductive adhesive in accordance with claim 23, further comprising at least two pairs of electrically conductive elements, wherein the at least two pairs of electrically conductive elements are each respectively separated by a gap, said fine interconnect particles having a minimum dimension less than said gap.

31. An anisotropic conductive adhesive connecting at least two components, which selectively conducts electricity directly across a gap between the at least two components, and does not short circuit displaced regions of the components which are not directly across the gap, comprising:
    (a) an electrically insulating adhesive carrier;
    (b) a plurality of fine interconnect particles suspended in said electrically insulating adhesive carrier, each of said fine interconnect particles having an outer surface and having a minimum dimension smaller than the gap, wherein an electrical circuit formed across the gap comprises at least two fine interconnect particles in contact with each other, said fine interconnect particles comprising shapes selected from the group consisting of one or more of solid and hollow regular polygons and irregularly shaped polygons; and
    (c) a plurality of conductive nano-structures having one or more shapes selected from the group consisting of columns, spikes, cylinders, tubes, hemispheres, fibers, rods, solid and hollow regular polygons, and irregularly shaped particles, forming a coating on at least a portion of said outer surface of said fine interconnect particles, the anisotropic conductive adhesive being formed by subjection to a compression across the gap to compress and mesh the plurality of nano-structures of the at least two fine interconnect particles, and curing of the electrically insulating adhesive carrier, and the formed anisotrophic conductive adhesive mechanically supports the components, excludes moisture from the gap, selectively conducts electricity and heat across the gap, and electrically insulates between components displaced along an axis perpendicular to the gap.

32. The anisotropic conductive adhesive in accordance with claim 31, wherein said plurality of fine interconnect particles are non-spherical.

33. The anisotropic conductive adhesive in accordance with claim 32, wherein said plurality of fine interconnect particles are cylindrical or tubular.

34. The anisotropic conductive adhesive according to claim 31, further comprising at least three electrical components contacting the cured electrically insulating adhesive carrier, wherein at least two of the at least three electrical components are in electrical communication through the plurality of fine interconnect particles having meshed conductive nano-structures, and at least two of the at least three electrical components are substantially electrically isolated through the cured electrically insulating adhesive carrier, and do not have an electrical pathway formed by a chain of meshed conductive nano-structures of adjacent fine interconnect particles therebetween.

* * * * *